United States Patent
Hegde

(10) Patent No.: US 7,439,105 B2
(45) Date of Patent: Oct. 21, 2008

(54) METAL GATE WITH ZIRCONIUM

(75) Inventor: Rama I. Hegde, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/366,279

(22) Filed: Mar. 2, 2006

(65) Prior Publication Data

US 2007/0207603 A1    Sep. 6, 2007

(51) Int. Cl.
*H01L 21/335* (2006.01)

(52) U.S. Cl. ............ 438/142; 257/204; 257/288; 257/310; 257/E21.177; 257/E21.632; 438/199

(58) Field of Classification Search .......... 438/197, 438/682, 136, 157, 142, 199; 257/412, 324, 257/368, 204, 288, 310, E21.177, E21.632
See application file for complete search history.

(56) References Cited

U.S. PATENT DOCUMENTS

| | | | |
|---|---|---|---|
| 2004/0222474 A1* | 11/2004 | Chau et al. | 257/369 |
| 2004/0266182 A1* | 12/2004 | Ku et al. | 438/682 |
| 2005/0085092 A1 | 4/2005 | Adetutu et al. | |
| 2005/0224886 A1 | 10/2005 | Doyle et al. | |
| 2005/0242406 A1 | 11/2005 | Hareland et al. | |
| 2006/0003507 A1* | 1/2006 | Jung et al. | 438/197 |
| 2006/0003517 A1 | 1/2006 | Ahn et al. | |
| 2006/0081948 A1* | 4/2006 | Lim et al. | 257/410 |

OTHER PUBLICATIONS

Noya, et al., Thermal Stablity of ZrN Barrier in W/ZrN/Poly-Si Gate Electrode Configuration, IEICE transactions on Electronics, E84-C, p. 704-6 No. 5 May 2001.
Zhiqiang Chen, et al., Stability of Ru- and Ta-based metal gate electrodes in contact with dielectrics for Si-CMOS, Phys. Stat. Sol. (b) 241, No. 10,2253-2267 (2004).
Samavedam SRI, et al., Evlatuation of Candidate Metals for Dual-Metal Gate CMOS with $HfO_2$ Gate Dielectric, MRS Proceedings, 716, p. 85-90 (2002).
David Gilmer, et al., Compatibility of polycrystalline silicon gate deposition with $HfO_2$ and $Al_2O_3/HfO_2$ gate dielectrics, Applied Physics Letters, vol. 81, No. 7, Aug. 12, 2002.
Jamie Schaeffer, et al., Physical and electrical properties of metal gate electrodes on $HfO_2$ gate dielectrics, J. Vac. Sci. Technology B 21(1) 11-17, Jan./Feb. 2003.
H. M. Ondik and H.F. McMurdie, Phase Diagrams for Zirconium and Zirconium Systems, The American Ceramic Society, p. 453, 1998.

* cited by examiner

*Primary Examiner*—Asok K Sarkar
(74) *Attorney, Agent, or Firm*—David G. Dolezal; Michael Balconi-Lamica

(57) ABSTRACT

A gate electrode (202) for a transistor including a metal gate structure (207) containing zirconium and a polycrystalline silicon cap (209) located there over. The metal gate structure (207) is located over a gate dielectric (205). The zirconium inhibits diffusion of silicon from the cap to the metal gate structure and gate dielectric. In one embodiment, the gate dielectric is a high K dielectric.

22 Claims, 2 Drawing Sheets

METAL GATE WITH ZIRCONIUM

BACKGROUND OF THE INVENTION

1. Field of the Invention

This invention relates in general to semiconductor devices and more specifically to semiconductor devices with metal gate structures.

2. Description of the Related Art

Some transistors utilize metal gate structures for improved performance over similar transistors with only polycrystalline silicon (poly silicon) gates. For example, utilizing a metal gate structure may provide a transistor with a lower sheet resistance, proper threshold voltage, and improved performance.

Some transistors with metal gates include a poly silicon cap in the gate stack for improved integration with other transistor formation processes. One problem with using a poly silicon cap on a metal gate structure is that silicon may diffuse into the gate structure and into the gate dielectric below the gate structure. Such diffusion may occur, for example, during high temperature activation anneal of the source/drain regions. Silicon diffusion into the metal gate structure may lead to poor capacitance-voltage behavior and increased gate leakage as well as defect formation (e.g. the formation of silicon nodules or other non uniformities) in the metal gate structure. Silicon diffusion into the gate dielectric may produce defects in the gate dielectric that may reduce the dielectric constant (K value) of the gate dielectric and increase the electrical thickness of the gate dielectric.

What is needed is an improved process for forming a metal gate in a semiconductor device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
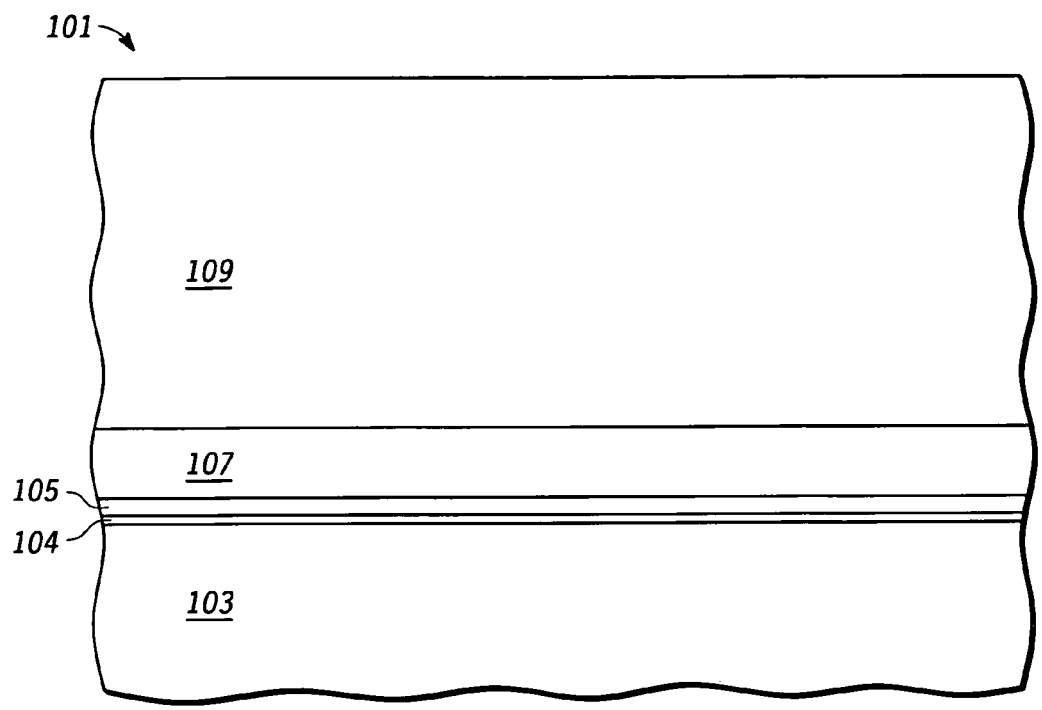
FIGS. 1-3 are partial side cutaway views of a wafer during various stages of its manufacture according to one embodiment of the present invention.

FIG. 1 is a partial side cutaway view of wafer 101 during a stage in its manufacture according to one embodiment of the present invention. Wafer 101 will be utilized in the formation of a transistor with a metal gate structure that includes zirconium for inhibiting the diffusion of silicon into the metal gate structure.

Wafer 101 includes a semiconductor substrate layer 103 which is made of a semiconductor material (e.g. silicon, silicon carbon, silicon germanium, silicon germanium carbide, gallium, gallium arsenide, indium arsenide, indium phosphide, other Group III-IV compound semiconductors, or any combination thereof). In the embodiment shown, substrate layer 103 has a bulk semiconductor material configuration, but may in other embodiments have other configurations such a semiconductor on insulator (SOI) configuration.

An interfacial dielectric layer 104 is located on substrate layer 103. In one embodiment, layer 104 is made of interfacial silicon oxide, but may be made of other materials of other embodiments. In one embodiment, layer 104 has a thickness of 10 angstrom or less, but may be of other thicknesses in other embodiments. Other embodiments may not include layer 104.

A layer 105 of gate dielectric material is formed on layer 104. In one embodiment, layer 105 is of a high K dielectric material (having a dielectric constant of 7.0 or higher). In one embodiment, layer 105 is made of hafnium zirconium oxide ($Hf_xZr_yO_z$), but in other embodiments, may be made of other dielectric materials e.g. of other oxides, silicates, or aluminates of hafnium, zirconium, aluminum, lanthanum, strontium, tantalum, titanium and combinations thereof. Such materials may include but are not limited to $Ta_2O_5$, $ZrO_2$, $HfO_2$, $TiO_2$, $Al_2O_3$, $Y_2O_3$, $La_2O_3$, $Hf_xSi_yO_z$, and $Hf_wSi_xN_yO_z$. In addition, multi-metallic oxides (for example barium strontium titanate, BST) may also be used in some embodiments.

In one embodiment, layer 105 is formed by depositing material using an atomic layer deposition (ALD), a chemical vapor deposition (CVD), or other conventional deposition processes. In other embodiments, layer 105 may be grown by an oxidation process of substrate layer 103. In one embodiment, layer 105 has thickness of 30-50 angstroms, but may have other thicknesses in other embodiments.

After the formation of layer 105, metal gate layer 107 is formed on layer 105. Metal gate layer 107 includes zirconium. In one embodiment, layer 107 also includes tantalum carbide ($Ta_xC_y$), but may include other metals e.g. tantalum nitride, tantalum silicon nitride, hafnium nitride, hafnium silicon nitride, molybdenum oxynitride, molybdenum nitride, molybdenum silicon nitride, titanium nitride, titanium silicon nitride, ruthenium based metal gates (ruthenium metal or ruthenium oxide), and iridium. The embodiments including molybdenum, ruthenium, and iridium may be used in gate electrodes of P-channel devices.

In one embodiment, layer 107 has a thickness of 100 angstroms. In other embodiments, layer 107 may have a thickness in the range of 10-250 Angstroms, but may have other thicknesses in other embodiments.

In one embodiment, the concentration of zirconium in layer 107 is in the range of 1 atomic percent or less for a layer including $Ta_xC_y$. However, in other embodiment embodiments, the zirconium may be of other concentrations e.g. 10 atomic percent or less. Still in other embodiments, the concentration of zirconium may be higher.

The zirconium in layer 107 may be in the form of zirconium nitride, zirconium oxide, a zirconium metal alloy (e.g. $Zr_xTa_yC_z$), or combinations thereof.

In one embodiment, layer 107 is formed by an ALD, CVD, physical vapor deposition (PVD), or other process.

A polycrystalline silicon layer 109 is formed on layer 107 e.g. by a CVD, ALD, PVD, or other process. In one embodiment, layer 109 has a thickness of 1000 angstroms, but may have other thicknesses in other embodiments.

Figure 2:
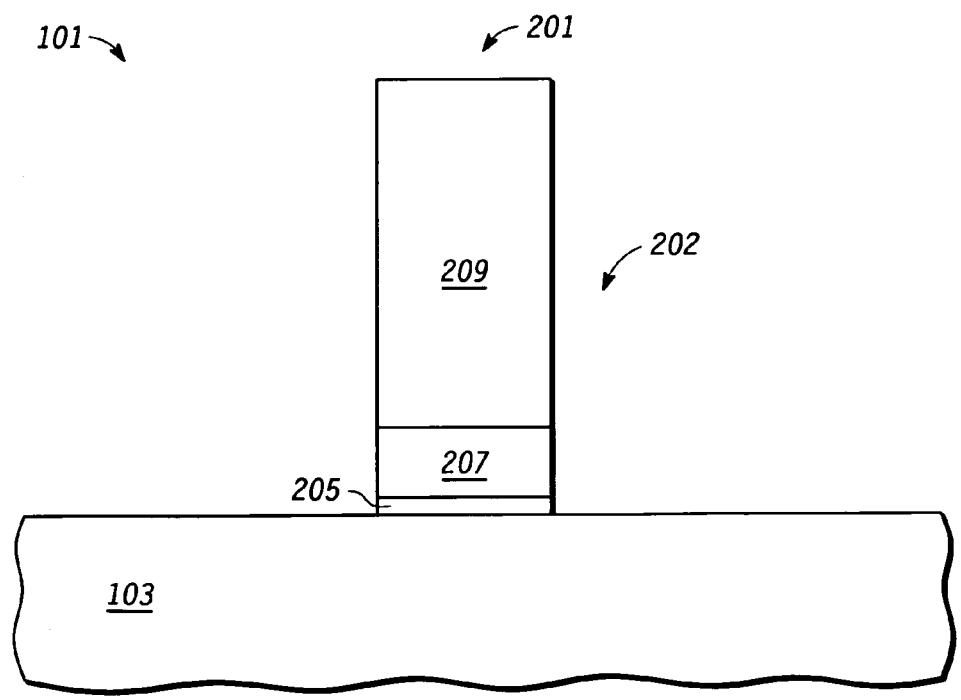

FIG. 2 is a partial side cutaway view of wafer 101 after gate stack 201 has been formed by patterning layer 109, layer 107, layer 105, and layer 104. In one embodiment, these layers are patterned by forming a mask pattern (not shown) over layer 109 and patterning the layers according to that pattern with etching processes having the appropriate etch chemistries for the material of the layers.

Gate stack 201 includes a gate electrode 202, which includes polycrystalline silicon cap 209 and metal gate structure 207. Cap 209 is formed from patterning layer 109, metal gate structure 207 is formed from patterning layer 107, and gate dielectric 205 is formed from patterning layers 105 and 104. Gate dielectric 205 includes material from both layers 105 and 104.

In the embodiment shown, the structures of gate stack 201 are formed according to the same pattern. However in other embodiments, the structures of gate stack 201 may have other configurations. For example, in some embodiments, gate dielectric 205 may formed from layers 104 and 105 after the patterning of layers 109 and 107 and subsequent formation of spacers (not shown) adjacent to the sidewalls of cap 209 and structure 207. In such embodiments, gate dielectric 205 would be wider than structure 207 and cap 209.

Figure 3:
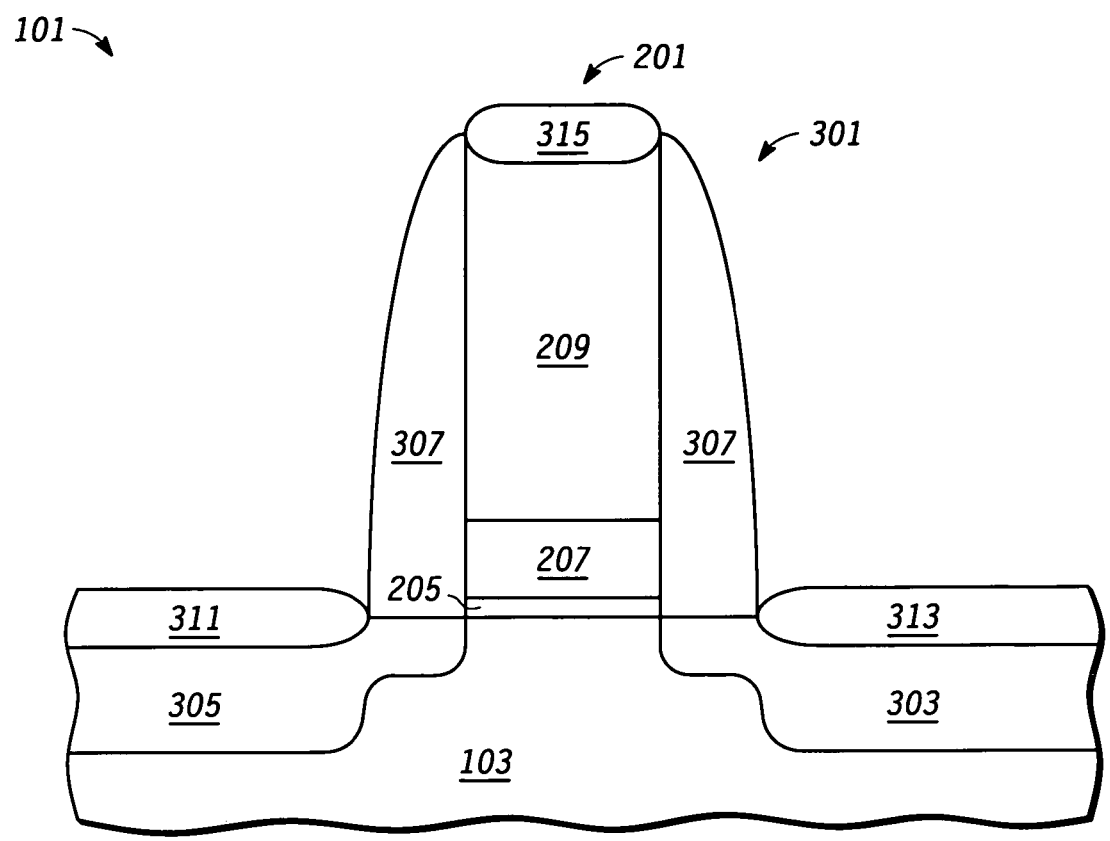

FIG. 3 shows a partial cut away side view of wafer 101 after the formation current electrode regions (source/drain regions 305 and 303), sidewall spacer 307, and silicides 311, 313, and 315.

In one embodiment, spacer 307 is formed by depositing a spacer material (e.g. silicon oxide or TEOS) over wafer 101 followed by an anisotropic etch of wafer 101. However, in other embodiments, spacer 307 may be formed by other processors, have other configurations, and/or may be formed of other materials.

Source/drain regions 303 and 305 are formed by ion implantation of dopants into substrate layer 103 and may include extension regions in some embodiments. Regions 303 and 305 may have other configuration and may be made by other processes in other embodiments. Silicides 311, 313, and 315 are formed by depositing a metal layer (not shown) of e.g. cobalt, nickel over wafer 101 and reacting the metal layer with exposed semiconductor material to form a silicide.

Wafer 101 includes other transistors (not shown) similar to transistor 301 including both N-Channel and P-channel type transistors. In subsequent processes, structures are formed on wafer 101 including contacts to suicides 311, 313, and 315, interconnect layers including interconnects and interlayer dielectrics, and external conductors (e.g. bond pads). Afterwards, wafer 101 may be singulated into individual integrated circuits and packaged into integrated circuit packages.

Providing a metal gate structure containing zirconium may in some embodiments, inhibit the diffusion of silicon from cap 209 into structure 207 and gate dielectric 205 e.g. during high temperature processes. Accordingly, the use of zirconium in structure 207 acts to prevent formation of silicon nodules in the gate stack, inhibit poor capacitance-voltage behavior, and inhibit increased gate leakage due to silicon diffusion. Also, the use of zirconium in structure 207 may inhibit the formation of defects in the gate dielectric, inhibit the reduction in the dielectric constant (K value) of the gate dielectric, and minimize the electrical thickness increase of the gate dielectric due to the diffusion of silicon into the gate dielectric 205 from cap 209. Accordingly, providing a metal gate with zirconium may be especially useful for transistors with high K dielectrics in inhibiting silicon diffusion that reduces the K value of the dielectric. Also, providing a metal gate structure including zirconium may also provide for improved transistor behavior such as improved threshold voltage instability and reliability. Furthermore, providing a metal gate structure with zirconium may improve the thermal stability of poly silicon with the metal gate structure.

In other embodiments, gate structure 207 may include multiple layers wherein one or more of the multiple layers includes zirconium and the other layers do not. In the embodiments shown, the gate electrode 202 is utilized in a planar transistor (transistor 301). However, a metal gate structure containing zirconium may be utilized in the gate stack of other types of transistors e.g. a FinFET transistor.

In one embodiment, a method of forming a gate electrode of a semiconductor structure includes providing a dielectric layer overlying a substrate. The dielectric layer has a surface. The method includes forming a metal gate layer over the surface of the dielectric layer. The metal gate layer contains zirconium. The method also includes forming a polycrystalline silicon cap layer overlying the metal gate layer.

In another embodiment, a method of forming a gate stack of a semiconductor device includes forming a gate dielectric layer overlying a substrate and forming a gate electrode over the gate dielectric layer. The forming the gate electrode includes forming a metal gate layer containing zirconium and forming a poly-silicon cap layer overlying the metal gate layer.

In another embodiment, a gate stack structure includes a dielectric layer overlying a substrate. The dielectric layer has a surface. The structure also includes a metal gate layer containing zirconium positioned over the surface of the dielectric layer and a polycrystalline silicon cap layer overlying the metal gate layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a gate electrode of a semiconductor structure comprising:
   providing a dielectric layer overlying a substrate, the dielectric layer having a surface;
   forming a metal gate layer over the surface of the dielectric layer, the metal gate layer containing zirconium, and
   forming a polycrystalline silicon cap layer overlying the metal gate layer;
   wherein zirconium incorporation in the metal gate layer is on an order of one atomic percent or less.

2. The method of claim 1, wherein the dielectric layer comprises a high-k dielectric material.

3. The method of claim 1, wherein the metal gate layer further comprises one of a group consisting of, tantalum nitride, tantalum silicon nitride, hafnium nitride, hafnium silicon nitride, molybdenum oxynitride, molybdenum nitride, molybdenum silicon nitride, titanium nitride, titanium silicon nitride, a ruthenium based metal, and iridium oxide.

4. The method of claim 1, wherein the forming the metal gate layer containing zirconium comprises forming by one of atomic layer deposition, phase vapor deposition, or chemical vapor deposition.

5. The method of claim 1, further comprising:
   patterning the polycrystalline silicon cap layer, patterning the metal gate layer, and
      patterning the dielectric layer into a gate stack of a semiconductor device.

6. The method of claim 1, wherein the metal gate layer further comprises tantalum carbide.

7. The method of claim 1 further comprising:
   forming a gate electrode for a transistor, wherein the forming the gate electrode includes patterning the metal gate layer and patterning the polycrystalline silicon cap layer;
   forming current electrode regions for the transistor, wherein the transistor is a P-channel type transistor.

8. A method of forming a gate electrode of a semiconductor structure comprising:
   providing a dielectric layer overlying a substrate, the dielectric layer having a surface;
   forming a metal gate layer over the surface of the dielectric layer, the metal gate layer containing zirconium, and
   forming a polycrystalline silicon cap layer overlying the metal gate layer;
   wherein the metal gate layer containing zirconium further comprises tantalum and carbon;
   wherein zirconium incorporation in the metal gate layer is on an order of one atomic percent or less.

9. The method of claim 8 further comprising:
   forming a gate electrode for a transistor, wherein the forming the gate electrode includes patterning the metal gate layer and patterning the polycrystalline silicon cap layer;
   forming current electrode regions for the transistor, wherein the transistor is a P-channel type transistor.

10. A method of forming a gate stack of a semiconductor device comprising:
    forming a gate dielectric layer overlying a substrate; and
    forming a gate electrode over the gate dielectric layer, wherein the forming the gate electrode includes forming a metal gate layer containing zirconium and tantalum carbide and forming a poly-silicon cap layer overlying the metal gate layer;
    wherein zirconium incorporation in the metal gate layer is on an order of one atomic percent or less.

11. The method of claim 10, further comprising:
    forming current electrode regions of the semiconductor device proximate opposite sides of the gate electrode within the substrate.

12. The method of claim 10, wherein the gate dielectric layer comprises a high-k dielectric material.

13. The method of claim 10, wherein the forming the metal gate layer containing zirconium includes forming by one of atomic layer deposition, phase vapor deposition, or chemical vapor deposition.

14. The method of claim 10 wherein:
    the gate electrode is a gate electrode for a P-channel type transistor;
    wherein the method further comprises forming current electrode regions for the P-channel type transistor.

15. A device comprising:
    a gate stack structure, the gate stack structure comprising:
       a dielectric layer overlying a substrate, the dielectric layer having a surface; and
       a metal gate layer containing zirconium positioned over the surface of the dielectric layer; and
       a polycrystalline silicon cap layer overlying the metal gate layer;
       wherein zirconium incorporation in the metal gate layer is on an order of one atomic percent or less.

16. The structure of claim 15, wherein the dielectric layer comprises a high-k dielectric material.

17. The structure of claim 16, further wherein the high-k dielectric material comprises one of a group consisting of hafnium, zirconium, aluminum, lanthanum, strontium, tantalum, and titanium.

18. The structure of claim 15, wherein the metal gate layer further comprises one of a group consisting of, tantalum nitride, tantalum silicon nitride, hafnium nitride, hafnium silicon nitride, molybdenum oxynitride, molybdenum nitride, molybdenum silicon nitride, titanium nitride, titanium silicon nitride, a ruthenium based metal, and iridium oxide.

19. The device of claim 15, wherein the metal gate layer further comprises tantalum carbide.

20. The device of claim 15 wherein the gate stack structure includes a gate electrode of a P-channel type transistor, the device further comprising:
    a first current electrode region of the P-channel type transistor;
    a second current electrode region of the P-channel type transistor.

21. A device comprising:
    a gate stack structure, the gate stack structure comprising:
       a dielectric layer overlying a substrate, the dielectric layer having a surface; and
       a metal gate layer containing zirconium positioned over the surface of the dielectric layer; and
       a polycrystalline silicon cap layer overlying the metal gate layer;
       wherein the metal gate layer containing zirconium further comprises tantalum and carbon;
       wherein zirconium incorporation in the metal gate layer is on an order of one atomic percent or less.

22. The device of claim 21 wherein the gate stack structure includes a gate electrode of a P-channel type transistor, the device further comprising:
    a first current electrode region of the P-channel type transistor;
    a second current electrode region of the P-channel type transistor.

* * * * *